United States Patent [19]
Chuang

[11] Patent Number: 5,892,356
[45] Date of Patent: Apr. 6, 1999

[54] HIGH IMPEDANCE LARGE OUTPUT VOLTAGE REGULATED CASCODE CURRENT MIRROR STRUCTURE AND METHOD

[75] Inventor: Shang-Yuan Chuang, Tucson, Ariz.

[73] Assignee: Burr-Brown Corporation, Tucson, Ariz.

[21] Appl. No.: 70,959

[22] Filed: May 1, 1998

[51] Int. Cl.$^6$ .............................. G05F 3/20; H03F 3/04
[52] U.S. Cl. ........................................ 323/315; 330/288
[58] Field of Search .................... 323/315, 316; 330/257, 288; 327/535, 539, 541, 543

[56] References Cited

U.S. PATENT DOCUMENTS

| | | | |
|---|---|---|---|
| 4,583,037 | 4/1986 | Sooch | 323/315 |
| 4,703,249 | 10/1987 | De La Plaza et al. | 323/316 |
| 4,857,864 | 8/1989 | Tanaka et al. | 330/288 |
| 4,990,864 | 2/1991 | Kwan | 330/288 |
| 5,038,114 | 8/1991 | Blanken et al. | 330/288 |
| 5,039,954 | 8/1991 | Bult et al. | 330/277 |
| 5,099,205 | 3/1992 | Lewyn | 330/288 |
| 5,142,696 | 8/1992 | Kosiec et al. | 455/260 |
| 5,300,822 | 4/1994 | Sugahara et al. | 323/315 |
| 5,359,296 | 10/1994 | Brooks et al. | 330/288 |
| 5,412,348 | 5/1995 | Kasha et al. | 330/288 |
| 5,442,318 | 8/1995 | Badyal et al. | 330/253 |
| 5,444,363 | 8/1995 | Cabler | 323/315 |
| 5,451,909 | 9/1995 | Fattaruso | 330/311 |
| 5,515,010 | 5/1996 | Peterson | 330/288 |
| 5,554,953 | 9/1996 | Shiayama et al. | 323/315 |
| 5,610,505 | 3/1997 | Bernardson et al. | 323/315 |
| 5,625,313 | 4/1997 | Etoh | 327/486 |
| 5,644,269 | 7/1997 | Wong et al. | 330/261 |
| 5,680,038 | 10/1997 | Fiedler | 323/315 |

*Primary Examiner*—Matthew Nguyen
*Attorney, Agent, or Firm*—Cahill, Sutton & Thomas P.L.C.

[57] ABSTRACT

The voltage swing on an output conductor of a high speed, high dynamic range regulated cascode current mirror is increased by providing a first transistor (M1) of a first conductivity type having a source electrode coupled to a first reference voltage conductor (GND), a gate electrode coupled to a first bias voltage circuit (M5,I1), and a drain coupled to a first conductor (4), a second transistor (M2) of the first conductivity type having a source electrode coupled to the first conductor (4), a gate electrode coupled to a second conductor (3), and a drain electrode coupled to the output conductor (2), and a third transistor (M3) of the first conductivity type having a source electrode coupled to the first reference voltage conductor (GND) and a drain coupled to the second conductor (3). A load circuit ($I_2$) is coupled between a second reference voltage conductor ($V_{DD}$) and the second conductor (3), wherein the third transistor (M3) and the load circuit ($I_2$) functions as a high speed amplifier (5) coupling voltage changes on the first conductor (4) to the gate electrode of the second transistor (M2). A constant voltage ($V_S$) is applied between the first conductor (4) and the gate of the third transistor (M3). The polarity of the constant voltage $V_S$ is set to maintain a voltage of the first conductor (4) at a minimum $V_{DS}$ magnitude level with respect to a voltage of the first reference voltage conductor (GND).

17 Claims, 7 Drawing Sheets

FIG. 1A
PRIOR ART
FIG. 1B
PRIOR ART
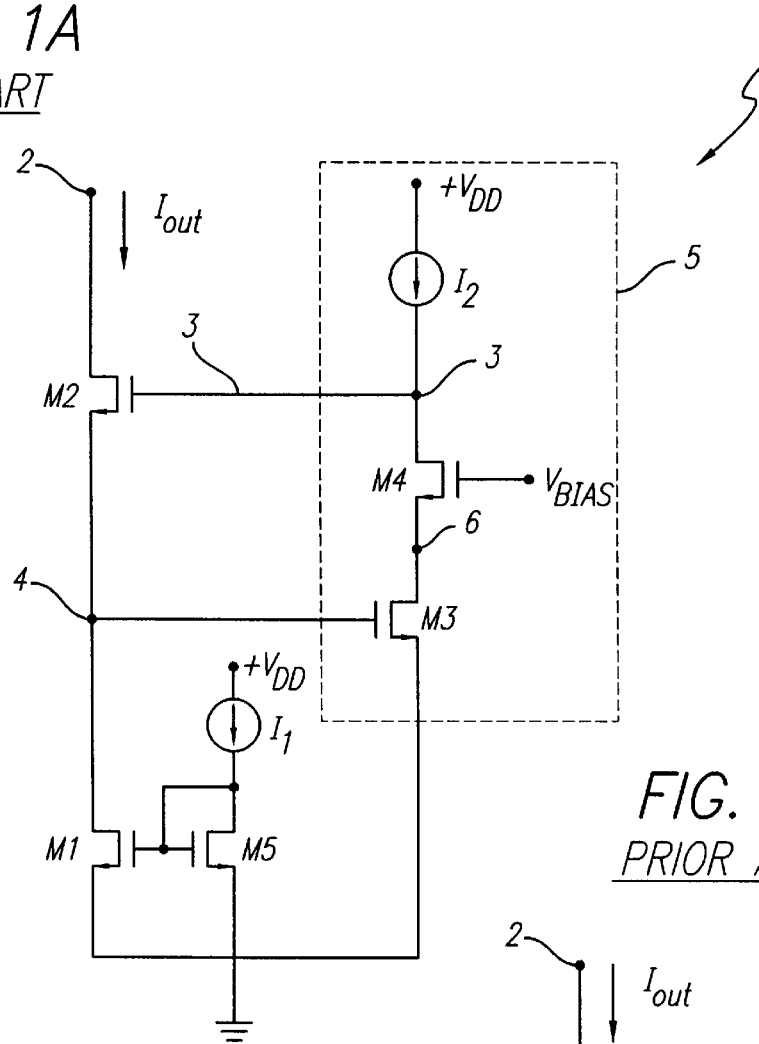
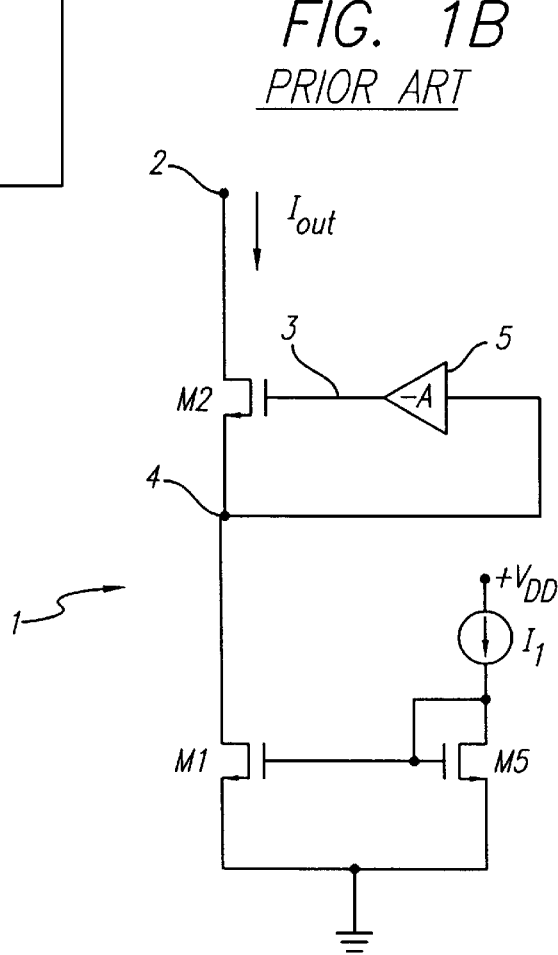

HIGH IMPEDANCE LARGE OUTPUT VOLTAGE REGULATED CASCODE CURRENT MIRROR STRUCTURE AND METHOD

BACKGROUND OF THE INVENTION

The invention relates to constant current source circuits, and more particularly to constant current source circuits that permit large output voltage swings at the terminal through which the constant current is supplied, and still more particularly to amplifier circuits that use the constant current source circuits as load devices.

FIG. 1A shows a prior art circuit of the type referred to as a regulated cascode current mirror. It produces an output bias current $I_{OUT}$ flowing through terminal 2. N-channel MOSFET M2 is a "cascode" transistor having its gate coupled to conductor 3, which is the junction between a constant current source I2 and the drain of N-channel MOSFET M4, which is an optional cascode transistor having its gate connected to a bias voltage $V_{BIAS}$. MOSFETs M3 and M4 and constant current source I2 constitute an inverting amplifier producing an output voltage on conductor 3 in response to an input voltage on conductor 4. Optional cascode MOSFET M4 increases the gain of that inverting amplifier, and therefore increases the output impedance at conductor 2. MOSFETs M1 and M5 and constant current source I1 constitute a conventional current mirror. The current I1 is "mirrored" through the drain electrode of MOSFET M1 to produce the constant current $I_{OUT}$.

The circuit shown in FIG. 1A is also illustrated in FIG. 1B, wherein the inverting amplifier including MOSFET M3 and current source I2 is designated as an amplifier 5 having a gain equal to –A.

A shortcoming of the regulated cascode current mirror circuit 1 shown in FIGS. 1A and 1B is that the voltage on output conductor 2 cannot swing over as wide a range as is desirable. Specifically, the lowest voltage that can appear on conductor 2 is equal to the sum of the gate-to-source voltage of MOSFET M3 and the drain-to-source voltage of MOSFET M2. Any lower voltage on conductor 2 turns MOSFET M3 off, making the circuit inoperative.

So-called CMOS gain enhancement operational amplifiers suffer from low output voltage range or swing, i.e., from low dynamic range. To solve this problem, various complex CMOS gain enhancement operational amplifiers have been used, including those having single-ended, current-mirroring, or fully differential structures. Because of their complexity, such complex gain enhancement amplifiers have had low gain-bandwidth products and high power dissipation, due mainly to parasitic capacitances associated therewith.

Thus, there is an unmet need for a CMOS gain enhancement operational amplifier which has higher output dynamic range, wider bandwidth, lower power dissipation, and requires less chip area than has been achievable in the prior art.

SUMMARY OF THE INVENTION

Accordingly, it is an object of the invention to provide a regulated cascode current mirror circuit in which the current output terminal voltage has a wide dynamic range.

It is another object of the invention to provide an inexpensive, low power, high bandwidth regulated cascode current mirror circuit in which the voltage output terminal can undergo a large output voltage swing.

It is another object of the invention to provide an improved, inexpensive lower power, high bandwidth CMOS gain enhancement operational amplifier having a larger dynamic range than has previously been achieved.

Briefly described, and in accordance with one embodiment thereof, the invention provides a high speed, high dynamic range regulated cascode current mirror including a first transistor (M1) of a first conductivity type having a source electrode coupled to a first reference voltage conductor (GND), a gate electrode coupled to a first bias voltage circuit (M5,I1), and a drain coupled to a first conductor (4), a second transistor (M2) of the first conductivity type having a source electrode coupled to the first conductor (4), a gate electrode coupled to a second conductor (3), and a drain electrode coupled to an output conductor (2), a third transistor (M3) of the first conductivity type having a source electrode coupled to the first reference voltage conductor (GND), a gate electrode coupled to the first conductor (4), and a drain coupled to the second conductor (3), a load circuit (I2) coupled between a second reference voltage conductor ($V_{DD}$) and the second conductor (3), wherein the third transistor (M3) and the load circuit (I2) functions as a high speed amplifier (5) coupling voltage changes on the first conductor (4) to the gate electrode of the second transistor (M2), and a constant voltage source (11) coupling the first conductor (4) to the gate of the third transistor (M3). The polarity of a constant voltage ($V_S$) produced by the constant voltage source 11 is selected so as to maintain a voltage of the first conductor (4) at a minimum $V_{DS}$ magnitude with respect to a voltage of the first reference voltage conductor (GND). The voltage source includes a capacitor (C1) which is dynamically charged to and maintained at a predetermined voltage ($V_S$). The predetermined voltage is equal to the difference between the operating gate-to-source voltage ($V_{GS3}$) of the third transistor (M3) and the operating drain-to-source voltage ($V_{DS1}$) of the first transistor.

The constant voltage source (11) includes a first capacitor (C1) coupled between the first conductor (4) and the gate (4A) of the third transistor (M3) and a dynamic circuit operative in response to a first clock signal ($\phi 1$) to maintain a voltage across the first capacitor (C1) equal to the difference between an operating ($V_{DS}$) voltage of the first transistor (M1) and an operating ($V_{GS}$) voltage of the third transistor (M3). The high speed, large dynamic range regulated cascode current mirror is used as a load circuit for an input transistor in an operational amplifier of a sample/hold circuit of a pipeline ADC.

BRIEF DESCRIPTION OF THE DRAWINGS

FIG. 1A is a schematic diagram of a prior art regulated cascode current mirror circuit.

FIG. 1B is a simplified block diagram structure of the regulated cascode current mirror of FIG. 1A.

DETAILED DESCRIPTION OF THE PREFERRED EMBODIMENTS

Figure 2A:
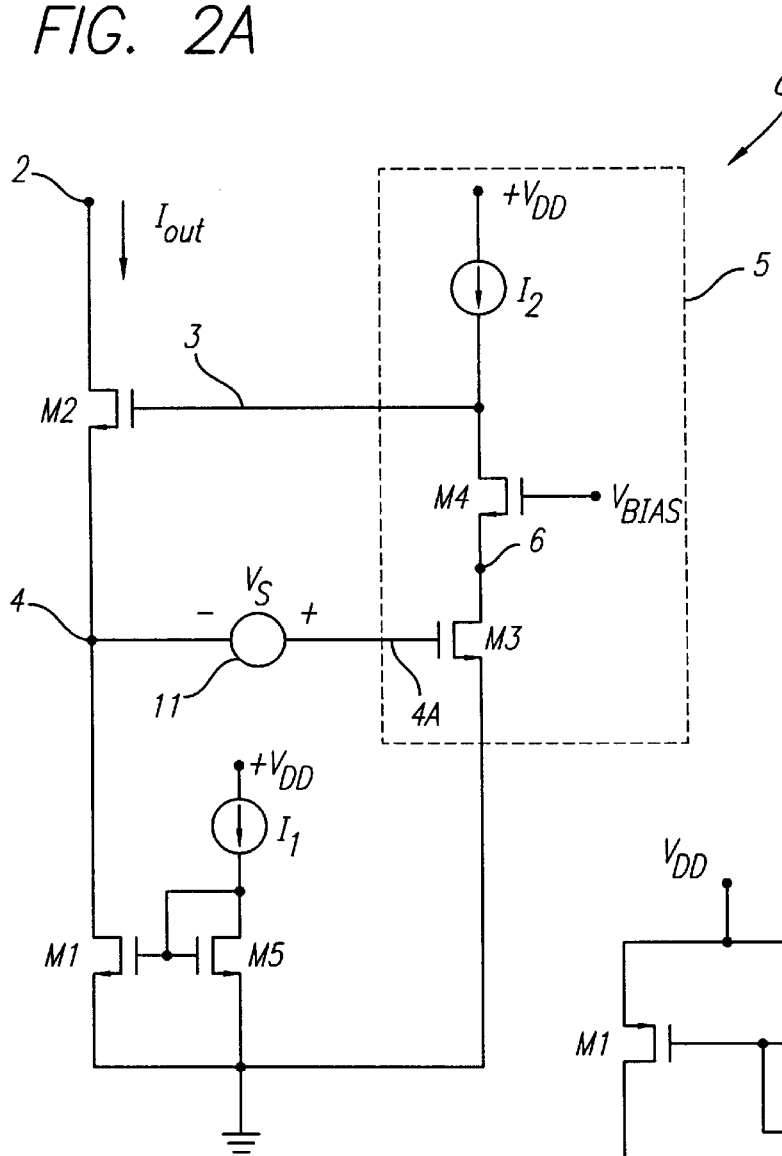
FIG. 2A is a schematic diagram of a regulated cascode current mirror circuit of the present invention.

Referring to FIG. 2A, the improved regulated cascade current mirror 10 of the present invention is identical to the prior art circuit 1 in FIG. 1A described above except that the gate of MOSFET M3 is connected by conductor 4A to the (+) terminal of a "floating" constant voltage source circuit 11 that produces a constant voltage $V_S$. The (−) terminal of constant voltage source 11 is connected to conductor 4. The constant voltage $V_S$ of voltage source 11 has a value equal to $V_{GS3}-V_{DS1}$, where $V_{GS3}$ is the normal gate-to-source "on" voltage of MOSFET M3 and $V_{DS1}$ is the normal drain-to-source "on" voltage of MOSFET M1 during operation of regulated cascade current mirror 10.

The use of constant voltage source circuit 11 allows the voltage of the source electrode of MOSFET M2 to be as low as $V_{DS1}$, without turning MOSFET M3 off. The voltage on conductor 2 therefore can swing from $+V_{DD}$ to as low as $V_{DS1}+V_{DS2}$, where $V_{DS2}$ is the normal minimum drain-to-source voltage of MOSFET M2 with the constant current $I_{OUT}$ flowing through it.

Figure 2C:
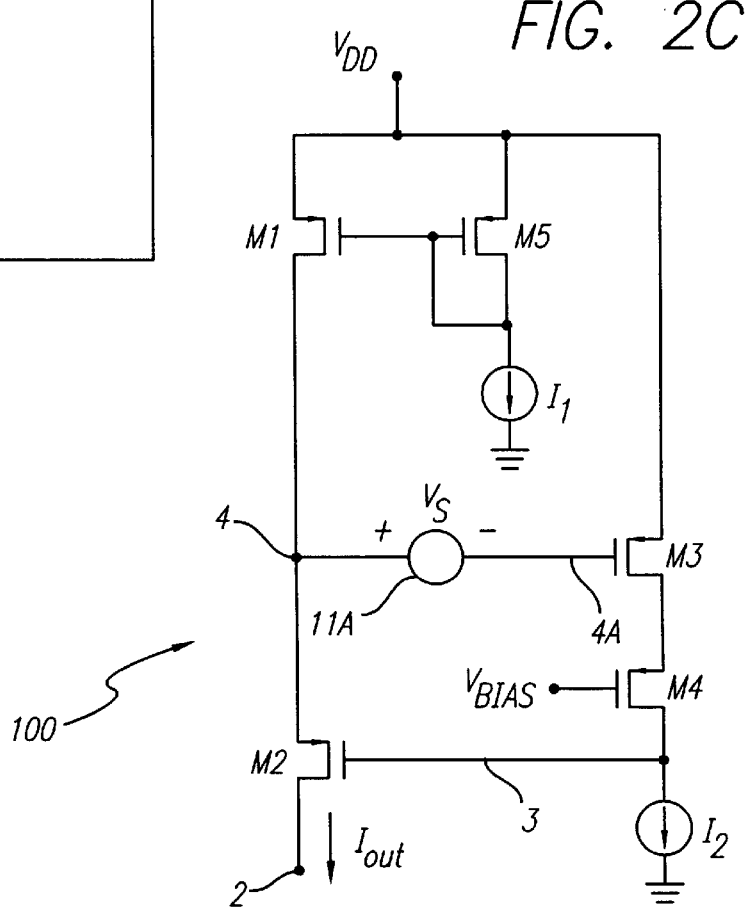
FIG. 2C is a schematic diagram of an embodiment of the circuit of FIG. 2A in which the conductivity types of the MOSFETs are reversed and the ground and power supply terminals are reversed.
Figure 2B:
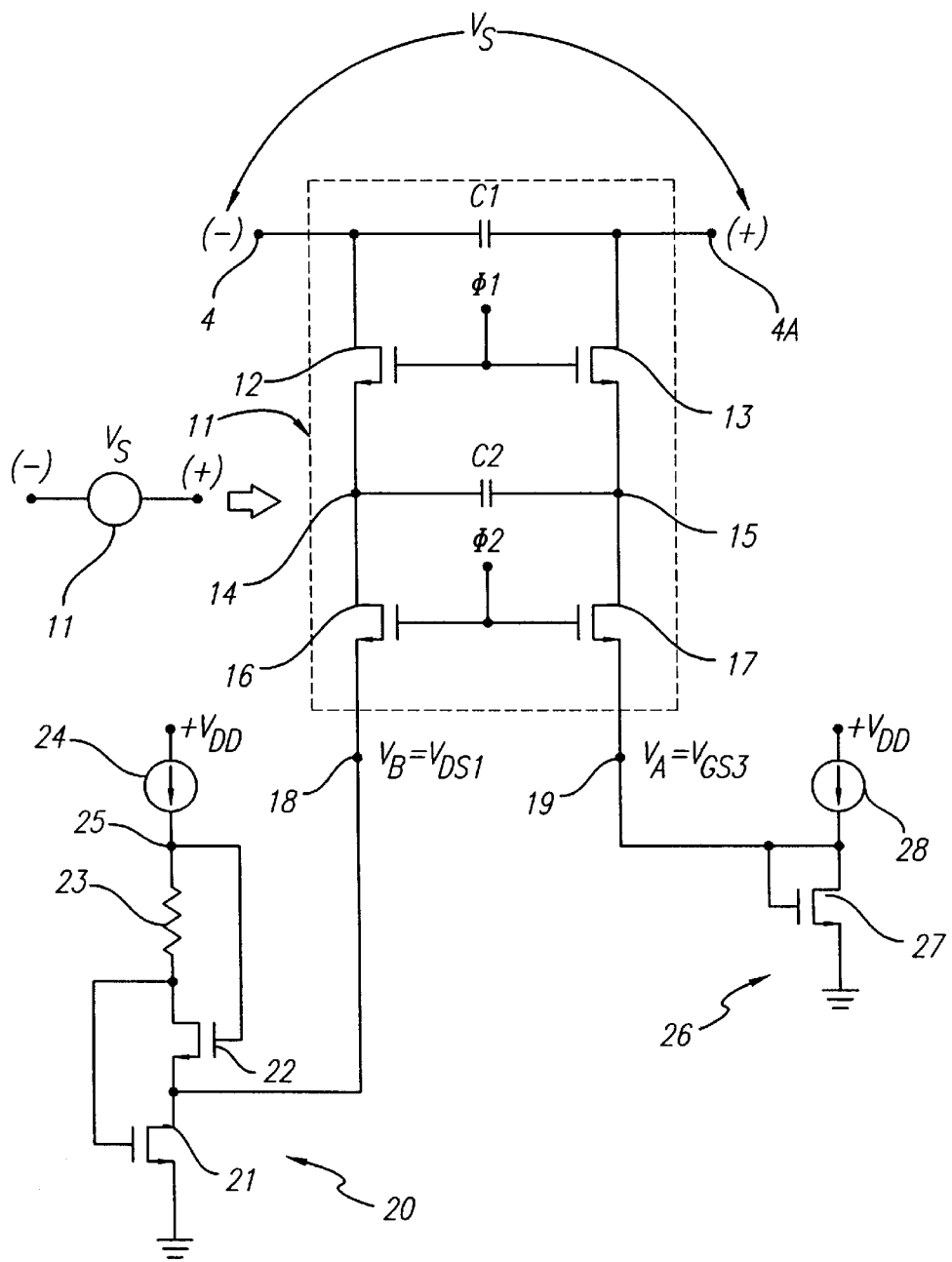
FIG. 2B is a schematic diagram illustrating a constant voltage source used in the circuit of FIG. 2A.

FIG. 2B illustrates one embodiment of constant voltage source 11, including a capacitor C1 connected between conductors 4 and 4A. An N-channel MOSFET 12 is coupled between conductors 4 and 14. An N-channel MOSFET 13 is coupled between conductors 4A and 15. MOSFETs 12 and 13 are turned on by a clock signal φ1. A second capacitor C2 is coupled between conductors 14 and 15. An N-channel MOSFET 16 is coupled between conductors 14 and 18, and MOSFET 17 is coupled between 15 and 19. MOSFETs 16 and 17 are turned on by a second clock signal φ2, which is out of phase with φ1. φ1 and φ2 are non-overlapping so that MOSFETs 16 and 17 are turned off before MOSFETs 12 and 13 are turned on.

A bias voltage $V_A$ is produced on conductor 19 by a circuit 26 including a constant current source 28 and a diode-connected N-channel MOSFET 27. With the constant current from current source 28 flowing through it, the bias voltage $V_A$, i.e., the gate-to-source voltage of MOSFET 27, is equal to the "on" $V_{GS3}$ voltage as MOSFET M3. A second bias voltage $V_B$ on conductor 18 is produced by a circuit 20 which includes a current source 24, a resistor 23, and two series-connected N-channel MOSFETs 22 and 21. The values of constant current source 24, resistor 23, and the geometries of MOSFETs 21 and 22 are selected such that $V_B$ equal to $V_{DS1}$.

FIG. 2C shows an embodiment 100 of the same circuit shown in FIG. 2A except that the conductivity types of the MOSFETs are reversed from those shown in FIG. 2A and the $+V_{DD}$ and ground terminal are reversed from those shown in FIG. 2A. In addition, the constant voltage circuit 11A of FIG. 5D is used instead of the one shown in FIG. 2B.

At this point, it would be helpful to realize that the new regulated cascode current mirror circuit of FIG. 2C is especially useful as a load device for an N-channel input transistor of a CMOS operational amplifier, especially in a sample and hold circuit used as the first stage of a pipeline analog-to-digital converter (ADC). Data rates of 20 to 30 megahertz are needed in a particular pipeline ADC. Therefore, a very fast, accurate sample and hold circuit which does not cause any distortion of the sampled analog input signal is needed.

An operational amplifier of such a fast sample and hold circuit needs to have a wide dynamic range to avoid "clipping" of the analog input signal being sampled, because such clipping obviously would distort the digital output signal to which the analog input signal is to be converted. As explained previously, the prior art regulated cascode current mirror circuit of FIG. 1A can not provide the dynamic voltage swing needed on conductor 2 to allow prior art regulated cascode current mirror circuit 1 of FIG. 1A to be utilized as a load device in the foregoing operational amplifier without causing unacceptable distortion of the analog input signal. The same considerations also would apply to an embodiment of prior art circuit 1 of FIG. 1A in which the transistor conductivity type and power supply conductors $V_{DD}$ and ground are reversed.

Providing a high-bandwidth current source that is capable of functioning as a large dynamic range load device for input transistors of a fast operational amplifier presents a significant challenge, because a fast internal amplifier 5 (FIG. 1B) is needed to drive the gate electrode of the current source output MOSFET M2. The required speeds of such internal amplifier 5 necessitates avoiding the use of a current mirror because current mirrors are inherently slow-responding circuits.

Figure 3:
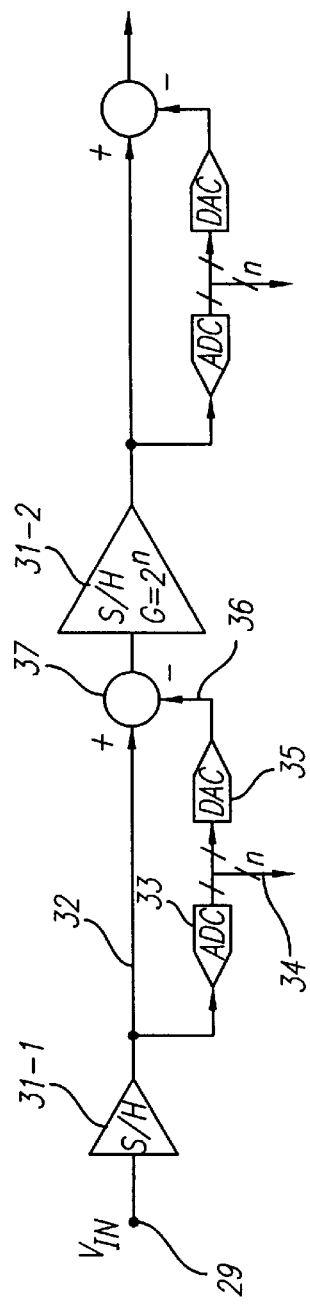
FIG. 3 is a block diagram of a pipeline analog-to-digital converter which utilizes the regulated cascode current mirror circuit of FIG. 2A in an input stage sample and hold circuit.

Referring next to FIG. 3, a high speed pipeline ADC 30 includes the first two stages 30-1 and 30-2 shown. The analog input voltage $V_{IN}$ is applied by conductor 29 to the input terminal of a sample and hold (S/H) circuit 31-1. S/H circuit 31-1 needs to have a very fast operational amplifier with a large dynamic output voltage swing. The output of S/H circuit 31-1 is connected by conductor 32 to the (+) input of a summing circuit 37 and to the input of an n-bit ADC 33. The output of ADC 33 is applied to the inputs of an n-bit DAC 35, the output 36 of which is connected to the (−) input of summer 37. The output of summer 37 is applied to the input of the next stage 30-2, which is essentially identical to the first stage except that circuit 31-2 constitutes both a sample and hold circuit and a gain stage having a gain of $2^n$, where n is the number of bits of ADC 33 and DAC 35 in FIG. 3.

Figure 4:
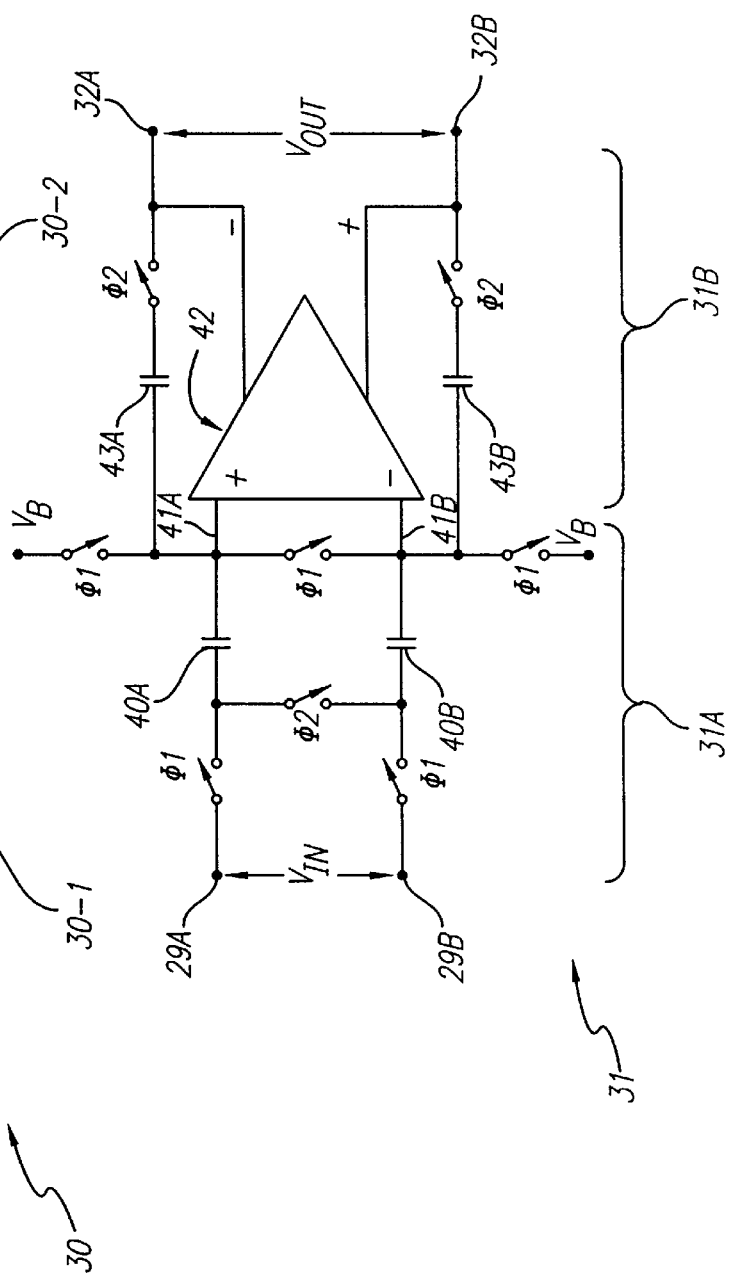
FIG. 4 is a schematic diagram of the sample and hold circuit 31 shown in FIG. 3.

FIG. 4 is a schematic diagram of the input stage S/H circuit 31-1 of pipeline ADC 30. Input S/H circuit 31-1 includes a switched capacitor sampling circuit 31A and an integrator 31B. Switched capacitor sampling circuit 31A includes input conductors 29A and 29B, which are coupled by a pair of switches to the left plates of sampling capacitors 40A and 40B during φ1. The right hand plates of capacitors 40A and 40B are connected together by another switch during φ1. Analog input $V_{IN}$ is applied between conductors 29A and 29B, and consequently is applied across the series connection of sampling capacitors 40A and 40B during φ1. During φ2, the charge on capacitors 40A and 40B is redistributed and stored on the integrating capacitors 43A and 43B of operational amplifier 42.

Figure 5A:
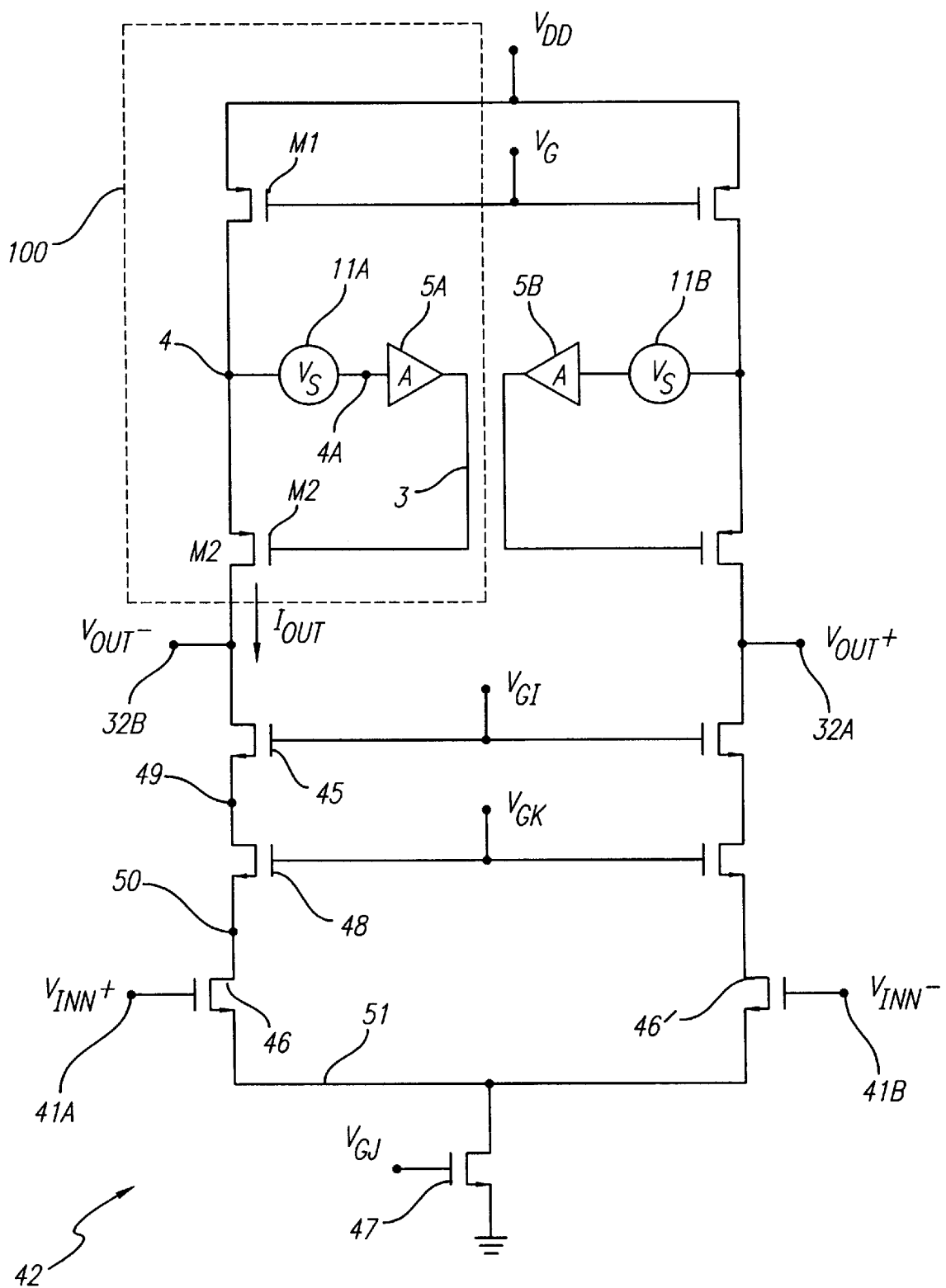
FIG. 5A is a schematic diagram of the operational amplifier 42 shown in the sample and hold circuit of FIG. 4.

FIG. 5A is a detailed schematic diagram of operational amplifier 42 of FIG. 3. Operational amplifier 42 includes a pair of N-channel input MOSFETs such as 46 having their source electrodes connected by conductor 51 to an N-channel current source MOSFET 47 having its source connected to ground. The gate of current source MOSFET 47 is biased by a bias voltage $V_{GJ}$. The differential input voltage $V_{INN}^+ - V_{INN}^-$ applied between conductors 41A and 42B produces a differential output signal between conductors 32B and 32A. For convenience, only the left half of differential operational amplifier 42 in FIG. 5A will be described.

The drain of input MOSFET 46 is connected by conductor 50 to the source of N-channel MOSFET cascode transistor 48, the gate of which is connected to a bias voltage $V_{GK}$. The drain of MOSFET 48 is connected by conductor 45 to the source of another N-channel cascode MOSFET 45, the gate of which is connected to another bias voltage $V_{GI}$. The drain of MOSFET 45 is connected by output conductor 32B to the drain of a P-channel MOSFET M2, which corresponds to MOSFET M2 in FIG. 2A. Portion 100 of operational amplifier 42 can be the regulated cascode current mirror circuit 100 shown in FIG. 2C. This circuit functions as the load device for N-channel input MOSFET 46 and cascode MOSFETs 45 and 48. The same reference numerals are used for regulated cascode current mirror load device 100 in FIG. 5A as in FIG. 2C.

Figures 5B, 5C:
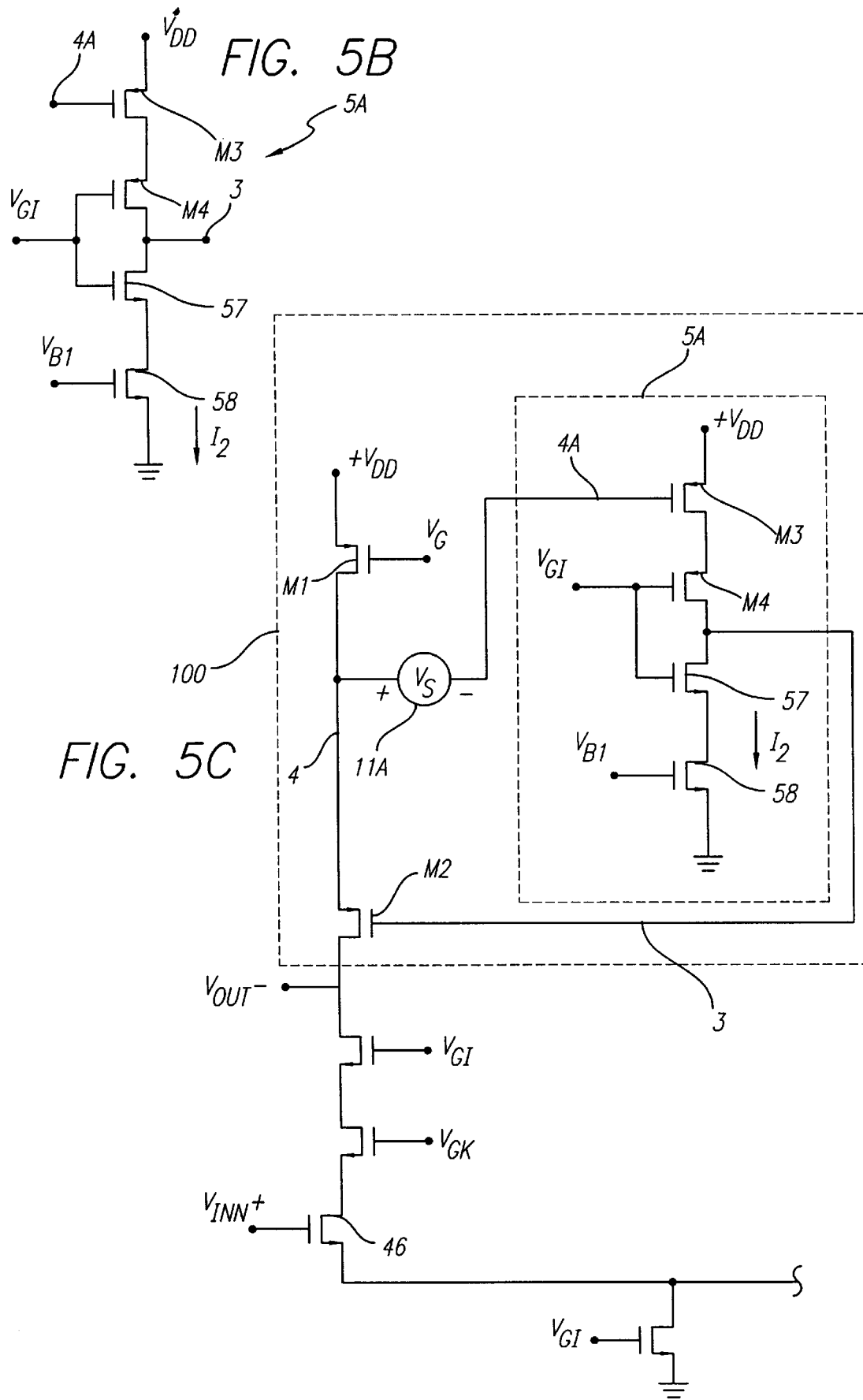
FIG. 5B is a schematic diagram of the operational amplifier included in the gain enhancement operational amplifier shown in FIG. 5A.
FIG. 5C is a schematic diagram of another implementation of the constant voltage source circuit shown in FIG. 2B, suitable for use in the operational amplifier of FIG. 5A, wherein the ground and power supply terminals are reversed from the arrangement in FIG. 2B and CMOS transmission gates rather than N-channel MOSFETs are used as the switches.
Figure 5D:
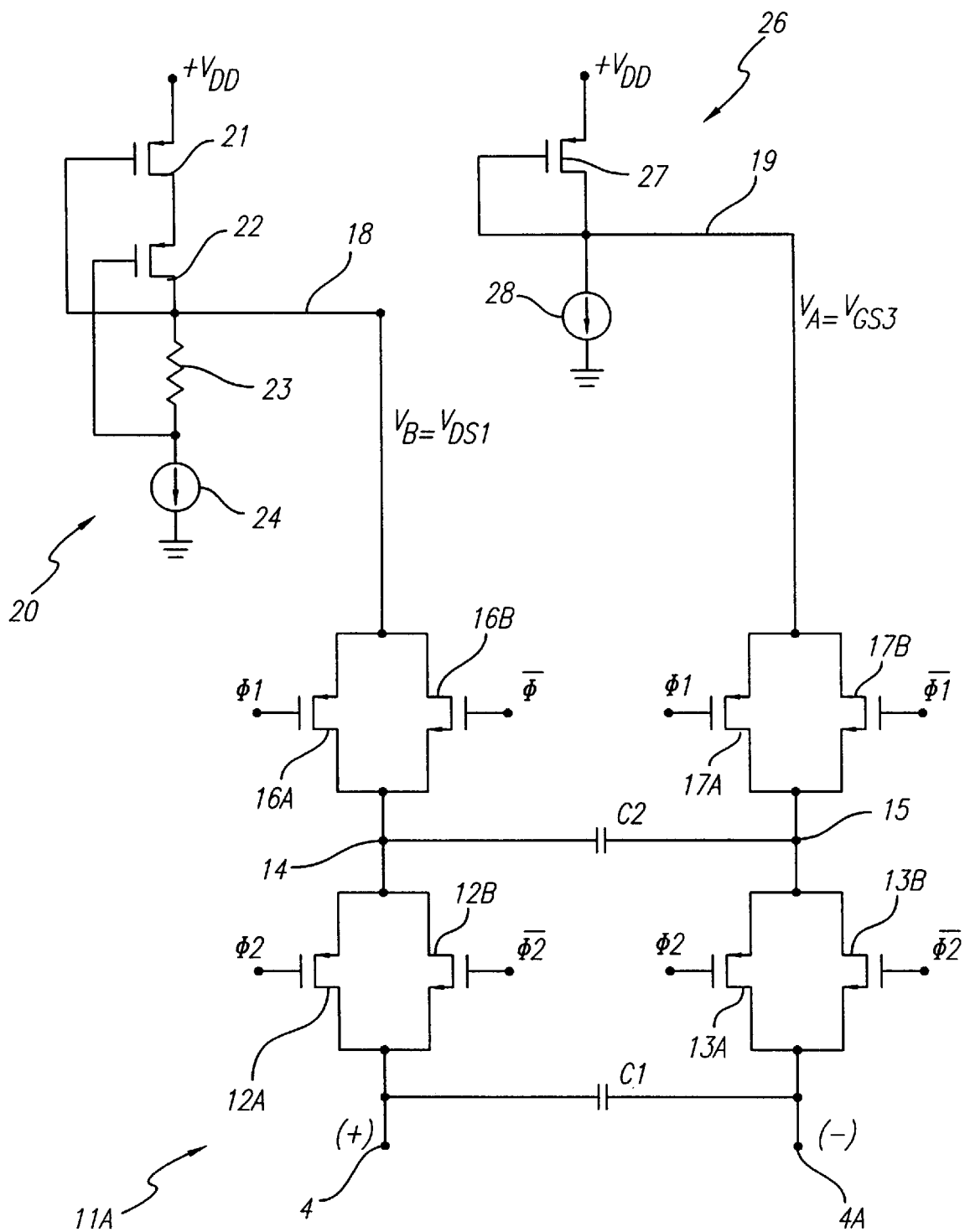
FIG. 5D is a detailed schematic circuit diagram of one-half of the operational amplifier of FIG. 5A, useful for explaining the operation thereof.

The details of amplifier 5A are shown in FIG. 5B, wherein its input conductor 4A is connected to the gate electrodes of P-channel MOSFET M3. The source of MOSFET M3 is connected to $+V_{DD}$ and its drain is connected to the source of P-channel MOSFET M4. MOSFET M4 is a cascode transistor, as in FIG. 2C, with its gate connected to $V_{GI}$. N-channel cascode MOSFET 57 has its gate connected to $V_{GI}$ and its drain connected to output conductor 3. Conductor 3 is connected to the drain of N-channel cascode MOSFET 57, the source of which is connected to the drain of N-channel MOSFET 58, the source of which is connected to ground. The gate of MOSFET 58 is connected to $V_{B1}$. MOSFETs 57 and 58 constitute the current source I2 of FIG. 2C. A suitable value of $+V_{DD}$ is +5 volts, and typical values of $V_G$, $V_{GI}$, $V_{GJ}$ and $V_{GK}$ are 4.3 volts, 2.0 volts, 1.0 volts, and 1.6 volts, respectively.

FIG. 5C illustrates half of operational amplifier 42 as shown in FIG. 5A, with the amplifier circuit of FIG. 5B substituted for the symbol shown in FIG. 5A for amplifier 5A.

Referring to FIG. 5A, it can be seen that the input signal $V_{INN}^+$ applied by conductor 41A to operational amplifier input transistor 46 can undergo large voltage swings in the course of sampling the analog input voltage $V_{IN}$ applied to the input of pipeline ADC 30 in FIG. 3. Consequently, the corresponding inverted output voltage $V_{OUT}^-$ appearing on conductor 32B undergoes corresponding large voltage changes. Therefore, it is essential that load circuit 100 connected to conductor 32B be able to respond to large, fast voltage changes on conductor 32B.

That is, the load device 100 must have a large dynamic range and a high speed response in order to avoid distortion of the sampled analog input voltage $V_{INN}^+$. This means that MOSFET M2 in FIG. 5C must be able to respond very accurately and very rapidly to voltage changes on conductor 4 in response to values of $V_{OUT}^-$ that vary from close to ground to close to $+V_{DD}$. Consequently, the constant voltage source 11A is required as described with reference to FIG. 5D. Also, amplifier 5A must be a fast, simple inverting amplifier circuit. The inverting amplifier circuit shown in FIG. 5B has been shown to meet this requirement.

Referring now to FIG. 5D, a dynamic voltage bias source 11A suitable for use in the regulated cascode current mirror circuit of FIG. 2C and also in the load circuits 100 in the operational amplifier shown in FIGS. 5A and 5C, includes a structure similar to the voltage reference circuit 11 described above with reference to FIG. 2B. However, in FIG. 5D a CMOS transmission gate 12A,12B is connected between conductors 4 and 14 and is clocked by φ2 and $\overline{\phi 2}$. Similarly, CMOS transmission gate 13A,13B, clocked by φ2 and $\overline{\phi 2}$, is connected between conductors 4A and 15. CMOS transmission gate 16A,16B, clocked by φ1 and $\overline{\phi 1}$, is connected between conductors 14 and 18. CMOS transmission gate 17A,17B, clocked by φ1 and $\overline{\phi 1}$, is connected between conductors 15 and 19. The bias voltage $V_B = V_{DS1}$ on conductor 18 is produced by a bias circuit 20 which corresponds to bias circuit 20 in FIG. 2B, except that the ground and $+V_{DD}$ references have been reversed and the transistors 21 and 22 are P-channel rather than N-channel. Similarly, the bias voltage $V_A = V_{GS3}$ on conductor 19 is produced by a bias circuit 26 that is similar to bias circuit 26 of FIG. 2B except that $+V_{DD}$ and ground have been reversed and transistor 27 is N-channel rather than P-channel. This configuration results in the desired value of $V_S$ between (+) terminal 4 and (−) terminal 4A.

Use of the improved operational amplifier, regulated cascode current mirror circuit, and the sample and hold circuit described above in a pipeline ADC allows accurate, high speed conversion of analog input signals which vary through an optimum peak-to-peak voltage range, with a high signal-to-noise ratio.

While the invention has been described with reference to several particular embodiments thereof, those skilled in the art will be able to make the various modifications to the described embodiments of the invention without departing from the true spirit and scope of the invention. It is intended that all elements or steps which are insubstantially different or perform substantially the same function in substantially the same way to achieve the same result as what is claimed are within the scope of the invention. The amplifier 5 can be provided using various other single ended amplifier circuits. A technique of using one differential amplifier as described in U.S. Pat. No. 5,442,318 instead of two single ended amplifiers in combination with the two constant voltage sources 11A and 11B in FIG. 5A also is within the present invention. The input transistors in FIG. 5A could be replaced by the folded cascode arrangement shown in U.S. Pat. No. 5,442,318.

What is claimed is:

1. A high speed, high dynamic range regulated cascode current mirror, comprising in combination:

(a) a first transistor of a first conductivity type having a source electrode coupled to a first reference voltage conductor, a gate electrode coupled to a first bias voltage circuit, and a drain coupled to a first conductor;

(b) a second transistor of the first conductivity type having a source electrode coupled to the first conductor, a gate electrode coupled to a second conductor, and a drain electrode coupled to an output conductor;

(c) a third transistor of the first conductivity type having a source electrode coupled to the first reference voltage conductor, a gate electrode coupled to the first conductor, and a drain coupled to the second conductor;

(d) a load circuit coupled between a second reference voltage conductor and the second conductor, wherein the third transistor and the load circuit amplify voltage changes on the first conductor to produce corresponding voltage changes on the gate electrode of the second transistor; and (e) a constant voltage source coupling the first conductor to the gate of the third transistor.

2. The high speed, large dynamic range regulated cascade current mirror of claim 1 wherein the polarity of a constant voltage produced by the constant voltage source is such as to maintain a voltage of the first conductor at a minimum $V_{DS}$ magnitude level with respect to a voltage of the first reference voltage conductor.

3. The high speed, large dynamic range regulated cascade current mirror of claim 1 further including a fourth transistor of the first conductivity type having a gate electrode coupled to a bias voltage and operative to couple the drain electrode of the third transistor to the second conductor.

4. The high speed, large dynamic range regulated cascade current mirror of claim 1 wherein the first conductivity type is n-type.

5. The high speed, large dynamic range regulated cascade current mirror of claim 1 wherein the first conductivity type is p-type.

6. The high speed, large dynamic range regulated cascade current mirror of claim 1 wherein the voltage source includes a capacitor which is dynamically charged to and maintained at a predetermined voltage.

7. The high speed, large dynamic range regulated cascade current mirror of claim 6 wherein the predetermined voltage is equal to the difference between the operating gate-to-source voltage of the third transistor and the operating drain-to-source voltage of the first transistor.

8. The high speed, large dynamic range regulated cascade current mirror of claim 1 wherein the first reference voltage conductor is a ground conductor and the second reference voltage conductor is a supply voltage conductor conducting a voltage which is positive relative to the ground voltage conductor.

9. The high speed, large dynamic range regulated cascade current mirror of claim 1 wherein the first reference voltage conductor is a positive supply voltage and the second reference voltage conductor is a ground voltage conductor.

10. The high speed, large dynamic range regulated cascode current mirror of claim 1 wherein the constant voltage source includes
a first capacitor coupled between the first conductor and the gate of the third transistor, and
a dynamic circuit operative in response to a first clock signal to maintain a voltage across the first capacitor equal to the difference between an operating $V_{DS}$ voltage of the first transistor and an operating $V_{GS}$ voltage of the third transistor.

11. The high speed, large dynamic range regulated cascode current mirror of claim 10 wherein the dynamic circuit includes a second capacitor, a fourth transistor coupled between a first terminal of the first capacitor and a first terminal of the second capacitor, a fifth transistor coupled between a second terminal of the first capacitor and a second terminal of the second capacitor, a sixth transistor coupled between the second terminal of the second capacitor and a first bias voltage equal to the operating voltage of the first transistor, and a seventh transistor coupled between the second terminal of the second capacitor and a second bias voltage equal to the operating voltage of the third transistor, gate electrodes of the fourth and fifth transistors being coupled to the first clock signal, and gate electrodes of the sixth and seventh transistors being coupled to a second clock signal which is non-overlapping with respect to the first clock signal.

12. The high speed, large dynamic range regulated cascode current mirror of claim 1 wherein the load circuit includes a constant current source coupled between the second reference voltage conductor and the second conductor.

13. An operational amplifier, comprising:
(a) a first input transistor of a first conductivity type having a source electrode coupled to a second reference voltage conductor, a gate electrode coupled to receive an input voltage, and a drain electrode coupled to an output conductor;
(b) a first load circuit including a high speed, large dynamic range regulated cascode current mirror including
 i. a first transistor of a second conductivity type P having a source electrode coupled to a second reference voltage conductor, a gate electrode coupled to a first bias voltage circuit, and a drain coupled to a first conductor;
 ii. a second transistor of the second conductivity type P having a source electrode coupled to the first conductor, a gate electrode coupled to a second conductor, and a drain electrode coupled to an output conductor;
 iii. a third transistor of the second conductivity type P having a source electrode coupled to the second reference voltage conductor, a gate electrode coupled to the first conductor, and a drain coupled to the second conductor;
 iv. a second load circuit source coupled between a first reference voltage conductor and the second conductor; the third transistor and the second load circuit amplify voltage changes on the first conductor to produce corresponding voltage changes on the gate electrode of the second transistor; and
 v. a constant voltage source coupling the first conductor to the gate of the third transistor.

14. The operational amplifier of claim 13, comprising:
(a) a second input transistor of a first conductivity type N having a source electrode coupled to a second reference voltage conductor, a gate electrode coupled to receive an input voltage, and a drain electrode coupled to an output conductor;
(b) a third load circuit including a high speed, high dynamic range regulated cascode current mirror, comprising in combination:
(a) a first transistor of a second conductivity type P having a source electrode coupled to a second reference voltage conductor, a gate electrode coupled to a first bias voltage circuit, and a drain coupled to a first conductor;
(b) second a transistor of the second conductivity type P having a source electrode coupled to the first conductor, a gate electrode coupled to a second conductor, and a drain electrode coupled to an output conductor;
(c) a third transistor of the second conductivity type P having a source electrode coupled to the second reference voltage conductor, a gate electrode coupled to the first conductor, and a drain coupled to the second conductor;
(d) a fourth load circuit coupled between a first reference voltage conductor and the second conductor; the third transistor and the fourth load circuit functions as a high speed amplifier coupling the effect of voltage charges on the first conductor to the gate electrode of the second transistor;
(e) a constant voltage source coupling the first conductor to the gate of the third transistor.

15. A sample and hold circuit comprising:
(a) a switched capacitor sampling circuit for sampling an analog input voltage;
(b) an operational amplifier receiving the sampled analog input voltage and holding it on a feedback capacitor coupled between an input and an output of the operational amplifier, the operation amplifier including
  i. a first input transistor of a first conductivity type N having a source electrode coupled to a second reference voltage conductor, a gate electrode coupled to receive an input voltage, and a drain electrode coupled to an output conductor;
  ii. a first load circuit including a high speed, large dynamic range regulated cascode current mirror, including
  (1) a first transistor of a second conductivity type P having a source electrode coupled to a second reference voltage conductor, a gate electrode coupled to a first bias voltage circuit, and a drain coupled to a first conductor;
  (2) a second transistor of the second conductivity type P having a source electrode coupled to the first conductor, a gate electrode coupled to a second conductor, and a drain electrode coupled to an output conductor;
  (3) a third transistor of the second conductivity type P having a source electrode coupled to the second reference voltage conductor, a gate electrode coupled to the first conductor, and a drain coupled to the second conductor;
  (4) a second load circuit coupled between a first reference voltage conductor and the second conductor; the third transistor and the second load circuit amplify voltage changes on the first conductor to produce corresponding voltage changes on the gate electrode of the second transistor; and
  (5) a constant voltage source coupling the first conductor to the gate of the third transistor.

16. A method of increasing the voltage swing on an output conductor of a high speed, high dynamic range regulated cascode current mirror, comprising:
(a) providing
  i. a first transistor of a first conductivity type having a source electrode coupled to a first reference voltage conductor, a gate electrode coupled to a first bias voltage circuit, and a drain coupled to a first conductor,
  ii. a second transistor of the first conductivity type having a source electrode coupled to the first conductor, a gate electrode coupled to a second conductor, and a drain electrode coupled to the output conductor;
  iii. a third transistor of the first conductivity type having a source electrode coupled to the first reference voltage conductor and a drain coupled to the second conductor;
  iv. a load circuit coupled between a second reference voltage conductor and the second conductor, wherein the third transistor and the load circuit amplify voltage changes on the first conductor to produce corresponding voltage changes on the gate electrode of the second transistor; and
(b) applying a constant voltage between the first conductor and the gate of the third transistor.

17. The method of claim 16 including setting the polarity of the constant voltage $V_S$ to maintain a voltage of the first conductor at a minimum $V_{DS}$ magnitude level with respect to a voltage of the first reference voltage conductor.

* * * * *